US010438827B2

(12) United States Patent
Feller et al.

(10) Patent No.: US 10,438,827 B2
(45) Date of Patent: Oct. 8, 2019

(54) METHODS AND SYSTEMS FOR SPIN-COATING MULTI-LAYER THIN FILMS HAVING LIQUID CONSERVATION FEATURES

(71) Applicant: Carbon, Inc., Redwood City, WA (US)

(72) Inventors: Bob E. Feller, San Mateo, CA (US); James M. Ian Bennett, San Francisco, CA (US)

(73) Assignee: Carbon, Inc., Redwood City, CA (US)

( * ) Notice: Subject to any disclaimer, the term of this patent is extended or adjusted under 35 U.S.C. 154(b) by 0 days.

(21) Appl. No.: 16/081,523

(22) PCT Filed: Jun. 30, 2017

(86) PCT No.: PCT/US2017/040363
§ 371 (c)(1),
(2) Date: Aug. 31, 2018

(87) PCT Pub. No.: WO2018/006011
PCT Pub. Date: Jan. 4, 2018

(65) Prior Publication Data
US 2019/0019700 A1    Jan. 17, 2019

Related U.S. Application Data

(60) Provisional application No. 62/357,614, filed on Jul. 1, 2016.

(51) Int. Cl.
*H01L 21/67* (2006.01)
*H01L 21/288* (2006.01)
(Continued)

(52) U.S. Cl.
CPC ...... *H01L 21/67253* (2013.01); *H01L 21/288* (2013.01); *H01L 21/6708* (2013.01);
(Continued)

(58) Field of Classification Search
CPC . B05B 3/1014; B05B 3/1035; C23C 18/1619; C23C 18/1628; H01L 21/02282; H01L 21/6715; Y10S 134/902
See application file for complete search history.

(56) References Cited

U.S. PATENT DOCUMENTS 6,436,851 B1 *  8/2002  Young .................. B05D 1/005
                                              438/782
6,919,913 B1 *  7/2005  Inada ................ H01L 21/67259
                                              348/61

(Continued)

FOREIGN PATENT DOCUMENTS

WO        9853923      12/1998
WO     20150159973    10/2015

OTHER PUBLICATIONS

International Search Report and Written Opinion for PCT/US2017/040363 dated Sep. 14, 2017, 13 pages.

*Primary Examiner* — Jaehwan Oh
(74) *Attorney, Agent, or Firm* — Myers Bigel, P.A.

(57) ABSTRACT

A system for retaining a spin-coating fluid when forming a thin film includes a rotatable chuck; a substrate on the rotatable chuck, the substrate having an interior area and an outer perimeter edge; and a fluid retention wall on the outer perimeter edge of the substrate, the fluid retention wall being configured to retain a spin-coating fluid deposited on the interior area of the substrate during rotation of the rotatable chuck.

15 Claims, 5 Drawing Sheets

(51) Int. Cl.
*H01L 21/683* (2006.01)
*H01L 21/768* (2006.01)

(52) U.S. Cl.
CPC .... *H01L 21/67248* (2013.01); *H01L 21/6838* (2013.01); *H01L 21/76838* (2013.01)

(56) References Cited

U.S. PATENT DOCUMENTS

| | | | | |
|---|---|---|---|---|
| 7,465,358 | B2 * | 12/2008 | Weidman | C23C 18/1601 118/429 |
| 7,615,117 | B2 * | 11/2009 | Kobayashi | B05D 1/005 118/320 |
| 7,615,119 | B2 * | 11/2009 | Benson | G03F 7/70341 118/504 |
| 8,991,329 | B1 | 3/2015 | Park et al. | |
| 2002/0110641 | A1 * | 8/2002 | Tanaka | H01L 21/6715 427/240 |
| 2004/0115567 | A1 * | 6/2004 | Mandal | B05C 5/027 430/324 |
| 2004/0248425 | A1 * | 12/2004 | Bem | B05O 5/001 438/758 |
| 2005/0284362 | A1 * | 12/2005 | Kim | H01L 21/6715 118/52 |
| 2006/0254616 | A1 * | 11/2006 | Brown | H01L 21/67109 134/2 |
| 2007/0167012 | A1 | 7/2007 | Tanaka | |
| 2008/0066786 | A1 * | 3/2008 | Hsieh | H01L 21/67028 134/34 |
| 2016/0379900 | A1 * | 12/2016 | Maehr | H01L 22/26 438/7 |

* cited by examiner

METHODS AND SYSTEMS FOR SPIN-COATING MULTI-LAYER THIN FILMS HAVING LIQUID CONSERVATION FEATURES

RELATED APPLICATIONS

This application is a 35 U.S.C. § 371 national phase entry of International Application No. PCT/US2017/040353, filed Jun. 30, 2017, which claims priority to U.S. Provisional Application Ser. No. 62/357,614, filed Jul. 1, 2016, the disclosures of which are incorporated by reference herein in their entireties.

FIELD OF THE INVENTION

The present invention relates to spin-coating methods and systems, and in particular, to methods and systems for spin-coating thin films and conserving solutions, such as solvents and solutes, used in the spin-coating methods.

BACKGROUND

Spin-coating processes are commonly employed, for example, in the manufacture of semiconductor devices. A base plate or substrate, such as a silicon wafer is spun on a turntable or chuck. A coating liquid is deposited on the substrate and is spread over the entire surface of the substrate by the centrifugal force from the rotation of the substrate.

The rotatable chuck may be placed in a spin-coating chamber, and excess coating liquid may collect in the chamber when it exits the outer perimeter of the substrate. Some spin-coating chambers include a discharge drain for draining excess coating liquid. However, significant amounts of coating liquid may be lost in this configuration, which may increase the cost of production.

SUMMARY OF EMBODIMENTS OF THE INVENTION

In some embodiments, a system for retaining a spin-coating fluid when forming a thin film is provided. The system includes a rotatable chuck; a substrate on the rotatable chuck, the substrate having an interior area and an outer perimeter edge; and a fluid retention wall on the outer perimeter edge of the substrate, the fluid retention wall being configured to retain a spin-coating fluid deposited on the interior area of the substrate during rotation of the rotatable chuck.

In some embodiments, a sealing member is between the fluid retention wall and the substrate, and the sealing member is configured to maintain a fluid seal between the substrate and the fluid retention wall. The fluid retention wall has a bottom portion that abuts the outer perimeter of the substrate and an upper portion that extends away from the outer perimeter of the substrate at an angle configured to retain the spin-coating fluid deposited on the interior area of the substrate during rotation of the rotatable chuck.

In some embodiments, the upper portion of the fluid retention wall comprises a first portion that extends generally perpendicular to the substrate and a second portion that extends toward the interior area of the substrate.

In some embodiments, fluid direction fins on the fluid retention wall are configured to redirect the spin-coating fluid toward the interior area of the substrate when a speed of rotation of the rotatable chuck is reduced. The fluid direction fins may extend from the fluid retention wall toward the interior area of the substrate at an angle and a curvature that is configured to redirect the spin-coating fluid toward the interior area of the substrate when a speed of rotation of the rotatable chuck is reduced.

In some embodiments, the rotatable chuck comprises an outer sealing member and interior channels configured to form a region of reduced pressure between the rotatable chuck and the substrate.

In some embodiments, the rotatable chuck comprises a notch on an outer perimeter that is configured to facilitate removal of the substrate.

In some embodiments, fastening members are configured to fasten the fluid retention wall to the rotatable chuck In some embodiments, a method for retaining a spin-coating fluid when forming a thin film is provided. The method includes a) rotating a rotatable chuck having a substrate thereon, the substrate having an interior area and an outer perimeter edge, wherein a fluid retention wall is on the outer perimeter edge of the substrate; and b) depositing a spin-coating fluid on the interior area of the substrate while rotating the rotatable chuck; and c) retaining a spin-coating fluid deposited on the interior area of the substrate on the fluid retention wall during rotation of the rotatable chuck to thereby form a thin film.

In some embodiments, retaining a spin-coating fluid deposited on the interior area of the substrate on the fluid retention wall during rotation of the rotatable chuck further comprises: d) rotating the rotatable chuck with the substrate thereon at a rotational velocity such that the spin-coating fluid coats the interior area of the substrate and is retained by the fluid retention wall, and e) changing the rotational velocity of the rotatable chuck such that at least some of the spin-coating fluid that is retained by the fluid retention wall flows into the interior area of the substrate. In some embodiments steps d) and e) are repeated.

In some embodiments, the spin-coating fluid is deposited on the substrate. In some embodiments, the substrate is removed from the rotational chuck and the spin-coating fluid is heated and/or cured on the substrate to provide a thin film. In some embodiments, the thin film is removed from the substrate. The methods may use the system described herein.

Some embodiments comprise a thin film formed by the methods described herein.

BRIEF DESCRIPTION OF THE DRAWINGS

The accompanying drawings, which are incorporated in and constitute a part of the specification, illustrate embodiments of the invention and, together with the description, serve to explain principles of the invention.

DETAILED DESCRIPTION OF EMBODIMENTS OF THE INVENTION

Figure 1:
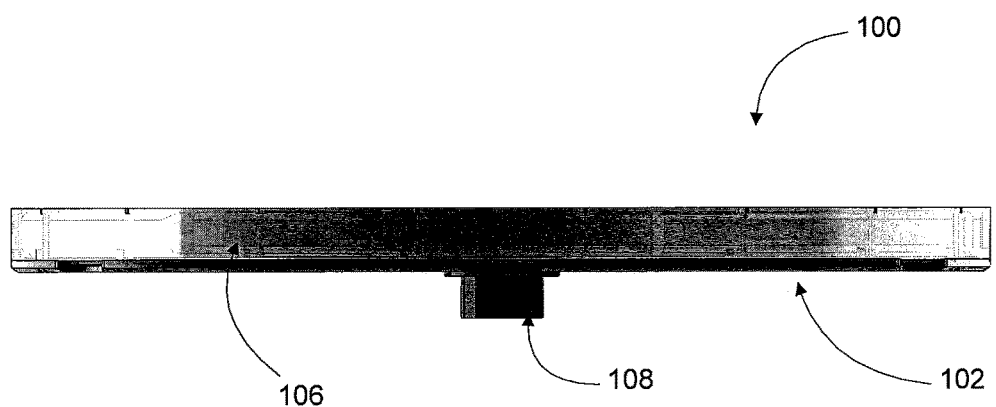
FIG. 1 is a side view of a system for retaining a spin-coating fluid when forming a thin film having a rotatable chuck, a substrate on the chuck, and a fluid retention wall on an outer perimeter edge of the substrate according to some embodiments.
Figure 2:
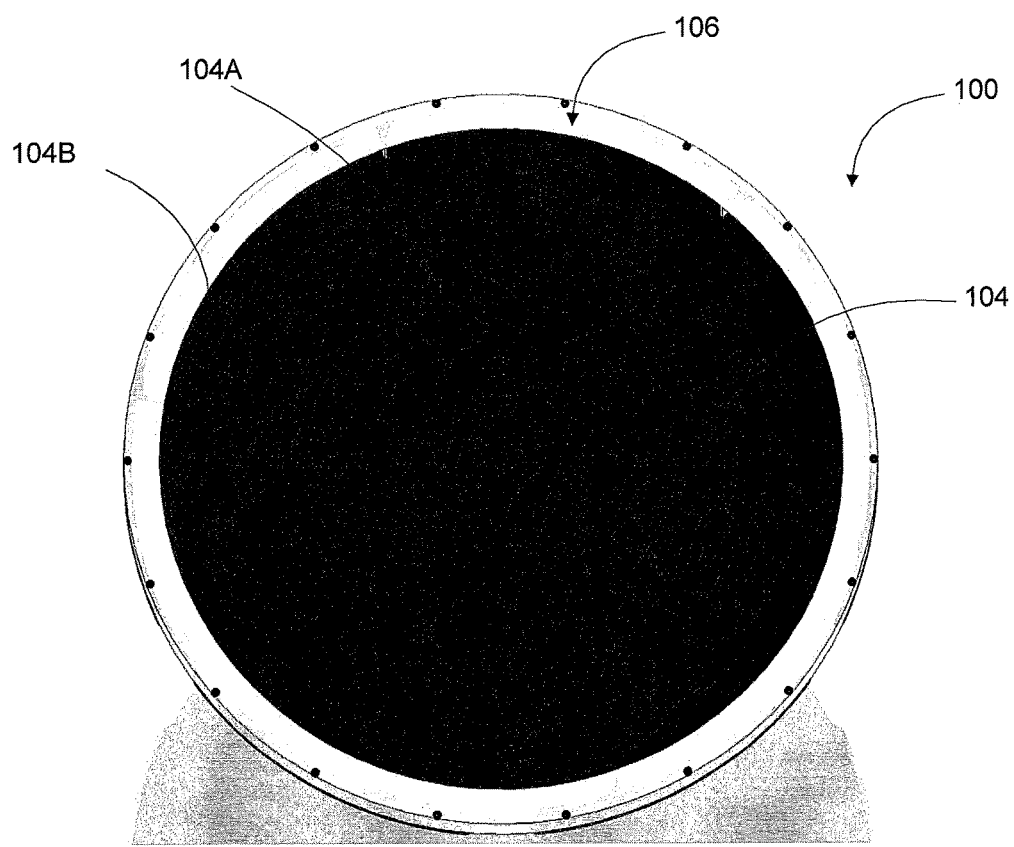
FIG. 2 is a top view of the system of FIG. 1.

The present invention now will be described hereinafter with reference to the accompanying drawings and examples, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under." The device may be otherwise oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only unless specifically indicated otherwise.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present invention. The sequence of operations (or steps) is not limited to the order presented in the claims or figures unless specifically indicated otherwise.

The present invention is described below with reference to block diagrams and/or flowchart illustrations of methods, apparatus (systems) and/or computer program products according to embodiments of the invention. It is understood that each block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, the present invention may be embodied in hardware and/or in software (including firmware, resident software, micro-code, etc.). Furthermore, embodiments of the present invention may take the form of a computer program product on a computer-usable or computer-readable non-transient storage medium having computer-usable or computer-readable program code embodied in the medium for use by or in connection with an instruction execution system.

The computer-usable or computer-readable medium may be, for example but not limited to, an electronic, optical, electromagnetic, infrared, or semiconductor system, apparatus, or device. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM).

Figure 3:
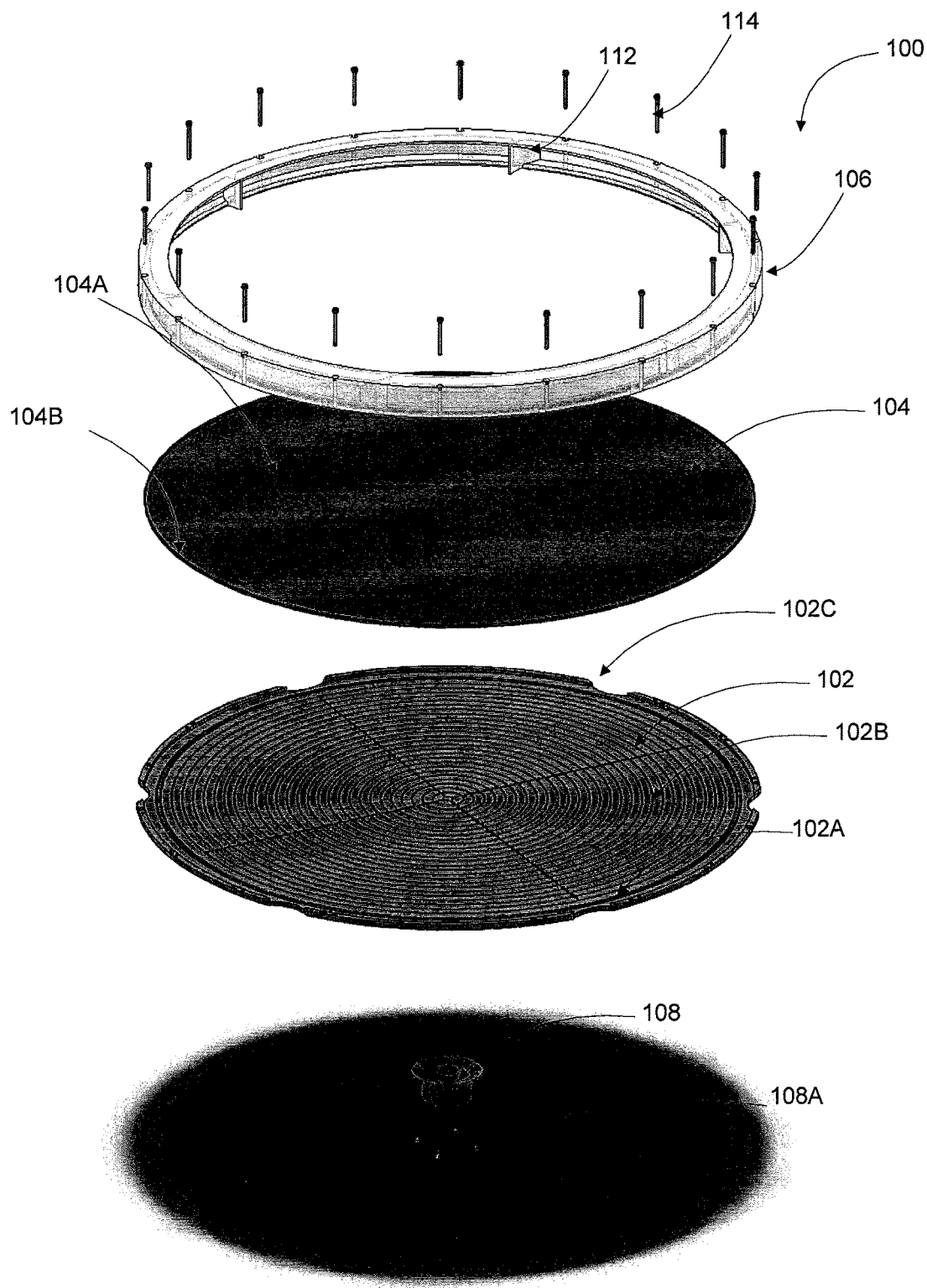
FIG. 3 is an exploded perspective view of the system of FIG. 1.
Figure 4:
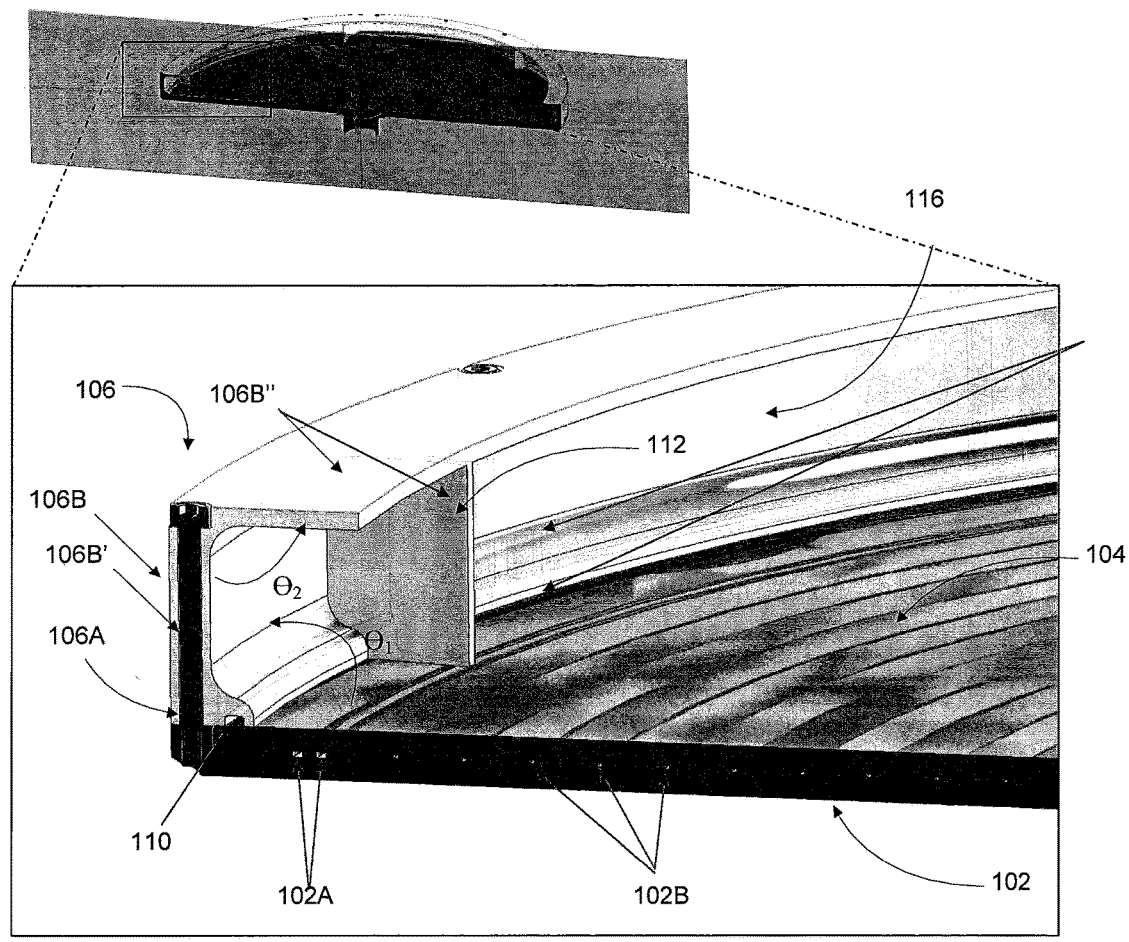
FIG. 4 is a detailed cross-sectional perspective view of the chuck, substrate and fluid retention wall of the system of FIG. 1.
Figure 5:
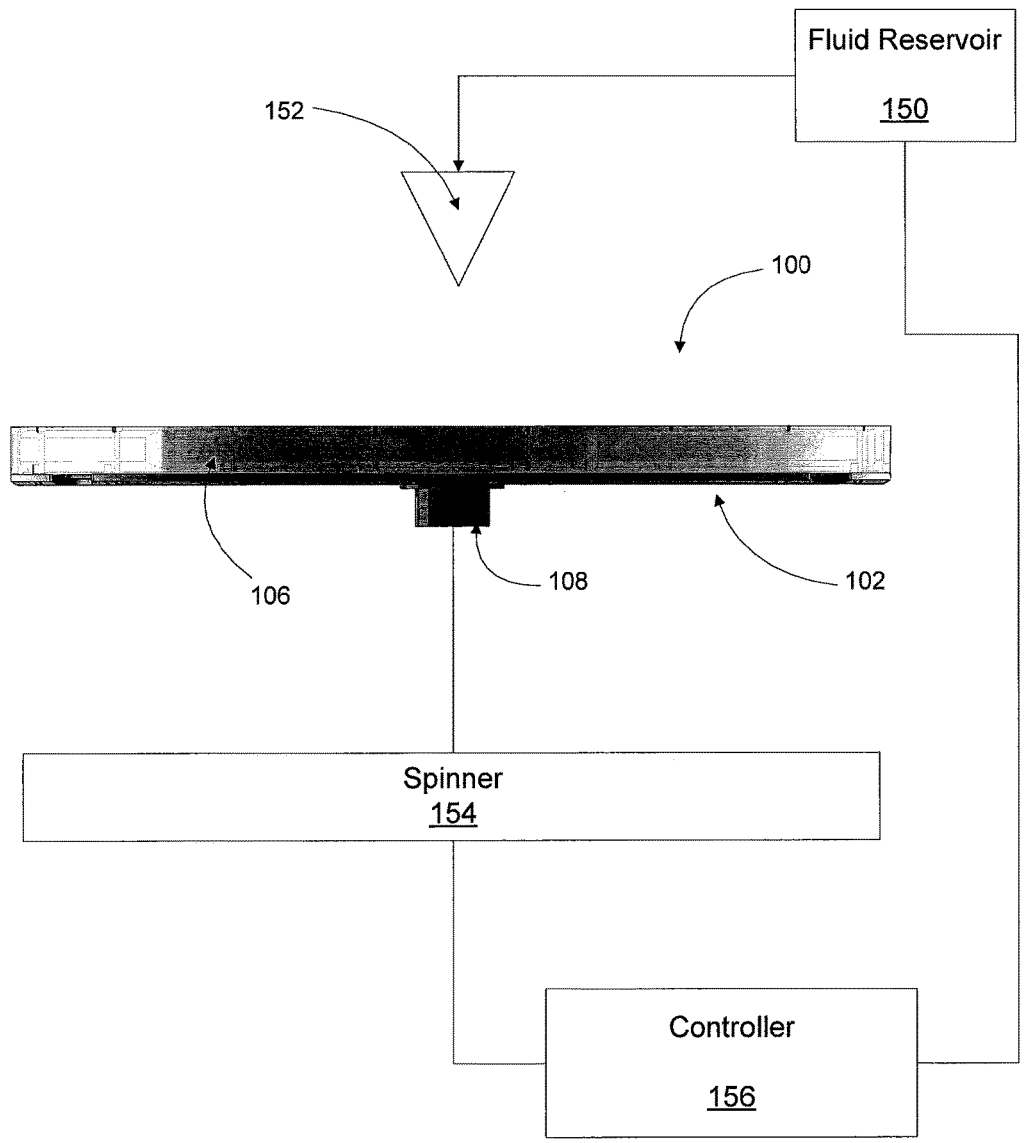
FIG. 5 is a schematic illustration of the system of FIG. 1 including a fluid reservoir and deposition nozzle, a spinner and a controller according to some embodiments.

As illustrated in FIGS. 1-5, a system 100 for retaining a spin-coating fluid when forming a thin film includes a rotatable chuck 102, a substrate 104 on the chuck, and a fluid retention wall 106. The substrate 104 includes an interior area 104A and an outer perimeter edge 104B. The fluid retention wall 106 is positioned on the outer perimeter edge 104B of the substrate 104. As shown in FIG. 3, the system 100 may include a base connector 108 that is connected to the chuck 102 by connection pins 108A. As illustrated in FIG. 5, the system may include a fluid reservoir 150 for holding a spin-coating fluid, and a deposition nozzle 152. The base connector 108 may connect the chuck 102 to a spinner 154 that rotates the chuck 102. A controller 156 may be in communication with the spinner 154 and fluid reservoir 150/deposition nozzle 152. A sealing member 110, such as an O-ring, may be positioned between the fluid retention wall 106 and the substrate 104 to maintain a fluid seal between the substrate 104 and the fluid retention wall 106. Fluid direction fins 112 are on the fluid retention wall 106, which may be held in position on the chuck 102 by fasteners such as pins 114.

As shown in FIG. 4, the fluid retention wall 106 includes a bottom portion 106A that abuts an outer perimeter of the substrate 104, and an upper portion 106B. The bottom portion 106A extends away from the substrate 104 intersects with the substrate 104 at an angle $\theta_1$. The upper portion 106B of the fluid retention wall 106 includes a portion 106B' that extends generally perpendicular to the substrate 104 and a portion 106B" that extends toward the interior area of the substrate 104 at an angle $\theta_2$ from the other portion 106B', which defines a fluid retention cavity 116. As illustrated in FIGS. 3 and 5, the chuck 102 includes an outer sealing member 102A and interior channels 102B and a notch 102C.

In this configuration, a substrate 104 is positioned on the chuck 102, and a region of reduced pressure may be formed in the interior channels 102B, for example, using a vacuum source connected to the base connector 108 or other suitable connection to the channels. Thus, the substrate 104 may be held on the chuck 102 by the reduced pressure in the interior channels 102B. The fluid retention wall 106 may be held on the substrate 104 and the chuck 102 by the pins 114. Although pins 114 are illustrated as holding the retention wall 106 on the chuck 102, it should be understood that other fastening mechanisms may be used, such as cooperating magnets on the retention wall 106 and the chuck 102.

Figure 6:
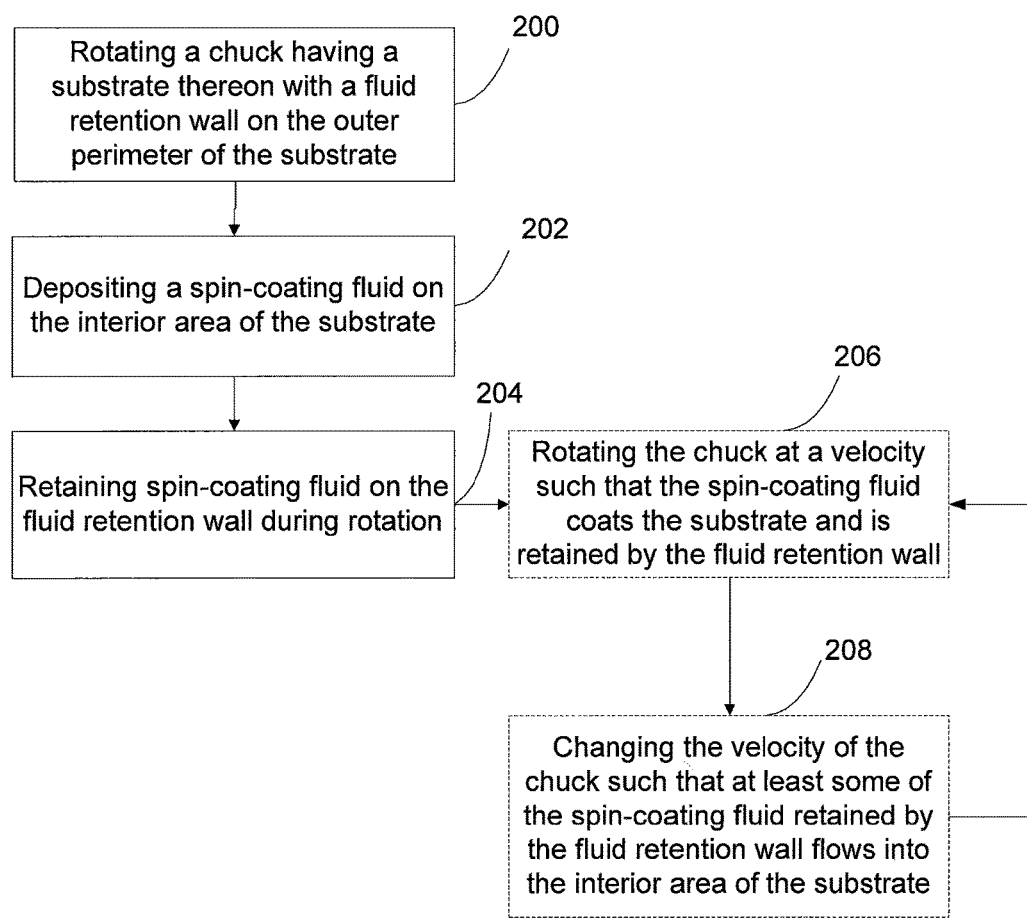
FIG. 6 is a flowchart illustrating operations according to some embodiments.

With reference to FIG. 6, the chuck 102 is rotated together with the substrate 104 and fluid retention wall 106 (Block 200). During this rotation, a spin-coating fluid is deposited on the interior area of the substrate 104 by the deposition nozzle 152 (Block 202). As the chuck 102 rotates, the fluid coats the substrate 104 and spreads from the interior of the substrate 104 to the perimeter edge. Excess spin-coating fluid is retained during rotation by the fluid retention wall 106 (Block 204). More specifically, the spin-coating fluid may be retained in the cavity 116 formed by the upper portion 106B. As illustrated, the upper portion 106B includes a portion 106B' that extends generally perpendicular to the substrate 104 such that the angle $\theta_1$ is about ninety degrees, and another portion 106B" that extends toward the interior area of the substrate 104 at an angle $\theta_2$ from the other portion 106B'. However, other configurations and angles $\theta_1$ and $\theta_2$ could be used. For example, the fluid retention wall 106 could be a continuously curved wall or a single upwardly extending wall without a portion extending toward the interior area of the substrate 104. Moreover, the cavity 116 may be open on one side as illustrated or may be open on more than one side and still retain the spin-coating fluid therein.

In some embodiments, the chuck 102 may be rotated at a velocity such that the spin-coating fluid coats the substrate and is retained by the fluid retention wall 106 (Block 206), and then the rotational velocity of the chuck 104 may be changed (e.g., the velocity may be reduced and/or the direction of spinning may be reversed) such that at least some of the spin-coating fluid retained by the fluid retention wall 106 flows back into the interior of the substrate (Block 208). Thus, the centrifugal force on the spin-coating fluid may be cyclically increased and decreased or the spin direction reversed so that the spin-coating fluid flows from the interior of the substrate 104 to the fluid retention wall 106 (coating the substrate 104), and then the spin-coating fluid flows from the fluid retention wall 106 back toward the interior of the substrate 104 to form an additional layer on the substrate 104. Blocks 206 and 208 may be repeated so that the spin-coating fluid flows generally away from the interior of the substrate 104 and is retained in the fluid retention wall 106 at higher rotational velocities and then flows generally toward the interior or center of the substrate 104 at lower rotational velocities so that any spin-coating fluid retained by the fluid retention wall 106 returns to the interior of the substrate 104 to provide additional coating layers on the substrate.

The fluid direction fins 112 are configured to redirect the spin-coating fluid toward the interior area of the substrate 104. For example, the fluid direction fins 112 may have be formed at an angle with respect to the fluid retention wall 106 such that when the chuck 102 spins in one direction or speed, the spin-coating fluid flows at least into the cavity 116, and when the chuck 102 spins at a slower speed or in a different direction, the spin-coating fluid is further directed into the interior of the substrate 104. It should be understood, however, that the fins 112 are optional, and in some embodiments, fluid retention and redirection by the fluid retention wall 106 may be achieved without the fins 112.

The resulting multi-layer spin-coated material may remain on the substrate 104. However, in some embodiments, the spin-coated material may be removed and lifted away from the substrate 104 and to provide a sheet or thin film of material.

Accordingly, multi-layer spin-coated materials may be formed while reducing a loss of the spin-coating fluid. Conventional spin-coating methods add a single layer of a spin-coating material, which covers the whole surface of a substrate, and excess spin-coating material is spun off the sides of the substrate. The fluid retention wall 106 may be used to coat multiple layers of spin-coating solution without spinning off excess fluid because spin-coating fluids are retained in the fluid retention wall 106. The excess fluids may, be used to form subsequent layers by changing the speed of the rotation of the chuck 102 so that the fluid retained in the retention wall 106 returns to the substrate 104, and then the chuck 102 is further rotated to spin coat additional layers. The methods and systems described herein may be particularly useful for materials that cannot be coated to desired thicknesses in a single coating application, such as low solubility materials, and efficiently forming multiple layers may be useful to form the desired thickness.

The fluid retention in the wall 106 also reduces wasted spin-coating fluids, which may be desirable, especially with precious or expensive spin-coating materials.

The spin-coating fluid may be a solution in which a solvent evaporates or partially evaporates during a spinning process to form a thin solid of the solute, which may include some remaining solvent. The remaining spin-coating liquid is spun into the retention wall 106 where it no longer interacts with the film. The speed at which the chuck 102 is spun is then reduced or spinning is stopped, which causes the liquid in the retention wall 106 to re-disperse over the area of the substrate 104. The momentum of the fluid may cause the fluid to remain spinning for some time after the spinning of the chuck 102 is reduced. The optional fluid direction fins 112 may further slow the fluid and redirect the fluid toward the interior area of the substrate 104.

For example, in some embodiments, the spin-coating fluid may be a solution including photoresists, including positive and negative photoresists, examples of which include but are not limited to epoxy photoresists such as SU-8, phenolic polymers such as Novolac and Resole resins, etc. optionally containing other components such as dissolution inhibitors (e.g., diazonaphthoquinone sulfonic acid esters (DNQs); gas separation membrane polymers, such as polyamide or cellulose acetate polymers; polymers for polymer film separation layers in batteries (polyethylene, polypropylene, poly (tetrafluoroethylene), polyvinyl chloride); a fluoropolymer, such as an amorphous thermoplastic fluoropolymer like TEFLON AF 1600™ or TEFLON AF 2400™ fluoropolymer films, of perfluoropolyether (PFPE), particulary to form a PFPE film or a silicone polymer film, and fluoropolymers, commercially available from DuPont. Additional materials include perfluoropolyether polymers such as, a polytetrafluoroethylene or a copolymer of polytetrafluoroethylene and 2,2-bistrifluoromethyl-4,5-difluoro-1,3-dioxole, poly (methyl glutarimide), polyhydroxystyrene-based polymers, block copolymers such as nanostructured polystyrene-block-poly (methyl methacrylate) (PS-b-PMMA), etc.

Any suitable solvent may be used. Examples include, but are not limited to, organic solvents such as acetone, gamma-butyrolactone, cyclopentanone, perfluorinated organic solvents such as Fluorinert®, Flutec®, Galden® and Vertrel®, Perfluoro-(2-perfluoro-n-buty)tetrahydrofuran, mixtures of formic acid and dichloromethane, etc. Solutions polymer in solvent may be prepared by stirring polymer powder with a solvent, rolling the mixture, or placing the mixture in an ultrasonic bath.

Additional examples of suitable polymers and solvents include but are not limited to those set forth in U.S. Pat. Nos. 8,980,418; 8,444,768; 7,449,280; and 7,282,324.

Additional processing steps may be performed on the spin-coated material, including curing steps such as thermal treatment, photonic curing, UV irradiation, etc. For example, the film may be cured by heating the film, e.g., from ambient to 140° C. over several hours and then maintained at 140° C. for an hour. The film may be subsequently baked with a two hour ramp time from ambient to 170° C., which is maintained for 48 hours.

Although the deposition nozzle 152 is illustrated at the center of the chuck 102 in FIG. 5, the nozzle 152 may be positioned in any location over the chuck 102. In some embodiments, the nozzle 152 may be used for continuous solvent replenishment. Every time a layer is coated, some of the solvent is removed by evaporation, and therefore, it may be desirable to maintain a more consistent fluid level by adding solution to the spin-coating fluid. In some embodiments, the nozzle 152 may be positioned over an edge portion of the substrate 104 so that additional solvent may be added during the recoating step. If solvent is added in the central region of the substrate 104 during the spinning process, the spin-coating fluid film will not dry out and layers may be difficult to form. In some embodiments, different spin-coating fluids may be added to the substrate 104 by the nozzle to form alternating layers of different materials. Spin-coating fluids used with prior layers may remain in the fluid retention wall 106 or be drained from the spin-coating system 100, for example, by opening an aperture or drain.

The substrate 104 may be removed from the chuck 102 before or after the optional curing step by removing the fluid retention wall 106 and by grasping the substrate 104 above the notches 102C of the chuck 102 and lifting the substrate 104. The spin-coated thin film may then be removed from the substrate 104 and optionally applied to other devices, or alternatively, the film may remain on the substrate for other uses.

The foregoing is illustrative of the present invention and is not to be construed as limiting thereof. Although a few example embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A system for retaining a spin-coating fluid when forming a thin film thereof, the system comprising:
   a rotatable chuck;
   a substrate on the rotatable chuck, the substrate having an interior area and an outer perimeter edge; and
   a fluid retention wall on the outer perimeter edge of the substrate, the fluid retention wall being configured to retain a spin-coating fluid deposited on the interior area of the substrate during rotation of the rotatable chuck,
   wherein the fluid retention wall has a bottom portion that abuts the outer perimeter of the substrate and an upper portion that extends away from the outer perimeter of the substrate at an angle configured to retain the spin-coating fluid deposited on the interior area of the substrate during rotation of the rotatable chuck and the upper portion of the fluid retention wall comprises a first portion that extends generally perpendicular to the substrate and a second portion that extends toward the interior area of the substrate.

2. The system of claim 1, further comprising a sealing member between the fluid retention wall and the substrate, the sealing member configured to maintain a fluid seal between the substrate and the fluid retention wall.

3. A system for retaining a spin-coating fluid when forming a thin film thereof, the system comprising:
   a rotatable chuck;
   a substrate on the rotatable chuck, the substrate having an interior area and an outer perimeter edge; and
   a fluid retention wall on the outer perimeter edge of the substrate, the fluid retention wall being configured to retain a spin-coating fluid deposited on the interior area of the substrate during rotation of the rotatable chuck, the system further comprising a plurality of fluid direction fins on the fluid retention wall, the fins configured to redirect the spin-coating fluid toward the interior area of the substrate when a speed of rotation of the rotatable chuck is reduced.

4. The system of claim 3, wherein the fluid direction fins extend from the fluid retention wall toward the interior area of the substrate at an angle and a curvature that is configured to redirect the spin-coating fluid toward the interior area of the substrate when a speed of rotation of the rotatable chuck is reduced.

5. The system of claim 1, wherein the rotatable chuck comprises an outer sealing member and interior channels configured to form a region of reduced pressure between the rotatable chuck and the substrate.

6. The system of claim 1, wherein the rotatable chuck comprises a notch on an outer perimeter that is configured to facilitate removal of the substrate.

7. The system of claim 1, further comprising fastening members configured to fasten the fluid retention wall to the rotatable chuck.

8. A method for retaining a spin-coating fluid when forming a thin film, the method comprising:
 a) rotating a rotatable chuck having a substrate thereon, the substrate having an interior area and an outer perimeter edge, wherein a fluid retention wall is on the outer perimeter edge of the substrate; and
 b) depositing a spin-coating fluid on the interior area of the substrate while rotating the rotatable chuck to thereby form a thin film; and
 c) retaining a spin-coating fluid deposited on the interior area of the substrate on the fluid retention wall during rotation of the rotatable chuck, wherein retaining a spin-coating fluid deposited on the interior area of the substrate on the fluid retention wall during rotation of the rotatable chuck further comprises: d) rotating the rotatable chuck with the substrate thereon at a rotational velocity such that the spin-coating fluid coats the interior area of the substrate and is retained by the fluid retention wall, and e) changing the rotational velocity of the rotatable chuck such that at least some of the spin-coating fluid that is retained by the fluid retention wall flows into the interior area of the substrate to thereby form another layer of the thin film.

9. The method of claim 8, further comprising repeating steps d) and e) to thereby form a thin film comprising a plurality of spin-coated layers.

10. The method of claim 8, wherein the spin-coating fluid comprises a first spin-coating fluid, the method further comprises adding a second spin-coating fluid to the substrate and rotating the rotatable chuck to thereby form a thin film having one or more layers formed from the first spin-coating fluid and one or more layers formed from the second spin coating fluid.

11. The method of claim 8, wherein the spin-coating fluid comprises a polymer.

12. The method of claim 11, wherein the spin-coating fluid comprises an organic solvent.

13. The method of claim 8, further comprising removing the substrate from the rotational chuck and heating and/or curing the spin-coating fluid on the substrate to provide a thin film.

14. The method of claim 13, further comprising removing the thin film from the substrate.

15. The method of claim 8, using the system of claim 1.

* * * * *